United States Patent
Roy et al.

(10) Patent No.: US 9,955,589 B2
(45) Date of Patent: Apr. 24, 2018

(54) ELECTRICAL INTERCONNECT FORMED THROUGH BUILDUP PROCESS

(71) Applicant: Intel Corporation, Santa Clara, CA (US)

(72) Inventors: Mihir K Roy, Chandler, AZ (US); Matthew J Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 13/717,048

(22) Filed: Dec. 17, 2012

(65) Prior Publication Data

US 2014/0166353 A1    Jun. 19, 2014

(51) Int. Cl.
*H05K 3/46*    (2006.01)
*H05K 3/40*    (2006.01)
(Continued)

(52) U.S. Cl.
CPC .......... *H05K 3/4647* (2013.01); *H01L 21/486* (2013.01); *H01L 23/49827* (2013.01);
(Continued)

(58) Field of Classification Search
CPC ............ Y10T 29/49165; H05K 3/4647; H05K 3/108; H05K 3/465; H05K 1/185;
(Continued)

(56) References Cited

U.S. PATENT DOCUMENTS 4,159,222 A * 6/1979 Lebow .................. H05K 3/205
156/153
5,231,757 A * 8/1993 Chantraine ......... H01L 21/4857
174/258

(Continued)

FOREIGN PATENT DOCUMENTS

CN    1794425 A    6/2006
CN    1917743 A    2/2007
(Continued)

OTHER PUBLICATIONS

"Chinese Application Serial No. 201310757420.X, Office Action dated Mar. 3, 2016", w/ English Translation, 20 pgs.

(Continued)

*Primary Examiner* — Peter DungBa Vo
*Assistant Examiner* — Kaying Kue
(74) *Attorney, Agent, or Firm* — Schwegman Lundberg & Woessner, P.A.

(57) ABSTRACT

This disclosure relates generally to an electronic chip package that can include a die and a buildup layer substantially enveloping the die. Electrical interconnects can be electrically coupled to the die and passing, at least in part, through the buildup layer. An optical emitter can be electrically coupled to the die with a first one of the electrical interconnects and configured to emit light from a first major surface of the electronic chip package. A solder bump can be electrically coupled to the die with a second one of the electrical interconnects and positioned on a second major (Continued)

surface of the electronic chip package different from the first major surface.

12 Claims, 7 Drawing Sheets

(51) Int. Cl.
- *H01L 23/498* (2006.01)
- *H01L 21/48* (2006.01)
- *H05K 3/10* (2006.01)
- *H01L 23/538* (2006.01)
- *H05K 1/18* (2006.01)

(52) U.S. Cl.
CPC .. *H01L 23/5389* (2013.01); *H01L 2924/0002* (2013.01); *H05K 1/185* (2013.01); *H05K 3/108* (2013.01); *H05K 3/465* (2013.01); *H05K 2203/0733* (2013.01)

(58) Field of Classification Search
CPC ...... H05K 2203/0733; H01L 23/49827; H01L 23/5389; H01L 21/486
USPC .......... 29/848, 850, 851, 852, 849, 846, 874
See application file for complete search history.

(56) References Cited

U.S. PATENT DOCUMENTS

| | | | | |
|---|---|---|---|---|
| 6,098,282 | A * | 8/2000 | Frankeny | H05K 1/162 174/255 |
| 6,828,510 | B1 * | 12/2004 | Asai | H05K 3/387 174/255 |
| 2001/0042637 | A1 * | 11/2001 | Hirose | H05K 3/0035 174/255 |
| 2003/0161129 | A1 * | 8/2003 | Kusano | H01L 23/4985 361/795 |
| 2004/0238209 | A1 * | 12/2004 | Yuri | H05K 1/056 174/257 |
| 2004/0238214 | A1 * | 12/2004 | Liu | H01L 21/4853 174/262 |
| 2005/0153547 | A1 * | 7/2005 | Barns | H01L 21/76879 438/677 |
| 2005/0224256 | A1 * | 10/2005 | Osawa | H05K 3/4614 174/260 |
| 2006/0044734 | A1 * | 3/2006 | Ahn | H01G 4/1209 361/313 |
| 2006/0185141 | A1 * | 8/2006 | Mori | H01L 23/49822 29/25.41 |
| 2007/0289127 | A1 * | 12/2007 | Hurwitz | H01L 21/4857 29/827 |
| 2008/0053693 | A1 * | 3/2008 | Wu | H05K 1/115 174/265 |
| 2008/0148561 | A1 * | 6/2008 | Magera | H05K 3/0035 29/852 |
| 2008/0277155 | A1 * | 11/2008 | Horiuchi | H05K 3/4602 174/264 |
| 2010/0132997 | A1 * | 6/2010 | Hando | H01L 23/49816 174/262 |
| 2012/0103667 | A1 * | 5/2012 | Ito | H01L 21/486 174/257 |

FOREIGN PATENT DOCUMENTS

| | | |
|---|---|---|
| CN | 102171605 A | 8/2011 |
| CN | 103871906 A | 6/2014 |
| KR | 101555531 B1 | 9/2015 |
| TW | 201436663 A | 9/2014 |
| TW | I522020 B | 2/2016 |

OTHER PUBLICATIONS

"Chinese Application Serial No. 201310757420.X, Office Action dated Jan. 18, 2017", w/English Translation, 8 pgs.

"Chinese Application Serial No. 201310757420.X, Office Action dated May 17, 2017", w/o English Translation, 7 pgs.

"Chinese Application Serial No. 201310757420.X, Office Action dated Jul. 28, 2016", w/ English Translation, 17 pgs.

"Chinese Application Serial No. 201310757420X, Response filed Mar. 27, 2017 to Office Action dated Jan. 18, 2017", w/ English Claims, 8 pgs.

"Chinese Application Serial No. 201310757420.X, Response filed May 31, 2016 to Office Action dated Mar. 3, 2016", (With English Translation), 9 pgs.

"Chinese Application Serial No. 201310757420.X, Response filed Oct. 10, 2016 to Office Action dated Jul. 28, 2016", w/English Claims, 11 pgs.

* cited by examiner

ELECTRICAL INTERCONNECT FORMED THROUGH BUILDUP PROCESS

TECHNICAL FIELD

The disclosure herein relates generally to the formation of electrical interconnects and methods therefor.

BACKGROUND ART

Electronic chip packages, printed circuit boards, and other electronic packages known in the art have long incorporated multiple layers of various types of material. Certain layers can utilize metal or other conductive material to create conductive lines for routing electrical signals from one place on the board to another or to establish ground planes and the like. Other layers can utilize an insulator, such as a dielectric, to physical separate electrically conductive layers and provide mechanical stability to the board. In order to provide electrical communication between conductive layers, electrically conductive structures, such as vias, can be created between conductive lines through intervening insulator layers. Vias are conventionally created by drilling through the insulator layer and applying a conductor within the via in electrical communication with the conductive lines according to various methods well known in the art.

DESCRIPTION OF THE EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Conventional electrical interconnect drilling, such as using laser drilling, mechanical drilling, and the like, may have a relatively high variation from interconnect to interconnect, even within the same board. Such variation may manifest itself in positional variation, x-y plane variation, size variation, shape variation, and the like. Conventional drilling processes can include margins of error that may be come increasingly significant as the size of components and traces of a board decrease. In an example, various drilling and via formation technologies may have an alignment tolerance of fifteen (15) micrometers, while a board fabrication process may provide minimum trace dimensions of between nine (9) and twelve (12) micrometers. Consequently, in various circumstances, such as those where vias are placed in close proximity of one another (e.g., in input/output zones) the utility of further decreases in trace size may be reduced because via size may not be similarly reduced accordingly, thereby reducing the potential increases in density on the board.

The present disclosure relates to creating vias through forming the via, for instance through a semi-additive process (SAP) rather than by drilling the via in the insulator. Stated differently, the via can be formed prior to, or potentially concurrently with, an insulator layer, with the insulator then potentially being formed around the via, rather than forming the insulator layer first and then cutting the insulator material away and forming the via in the already-built insulator. Because such a via can be built according to, for instance, the same, similar, or related process as can be utilized to form the traces in the board, the via can be built to the same or similar tolerances as the trances. Furthermore, because such vias are not reliant on processes that remove insulation, the vias can be of a configurable and selectable shape and size. In various examples, the vias can be sized to be the same or similar size to input/output pads and electrically conductive traces within an electronic package.

Figure 1A:
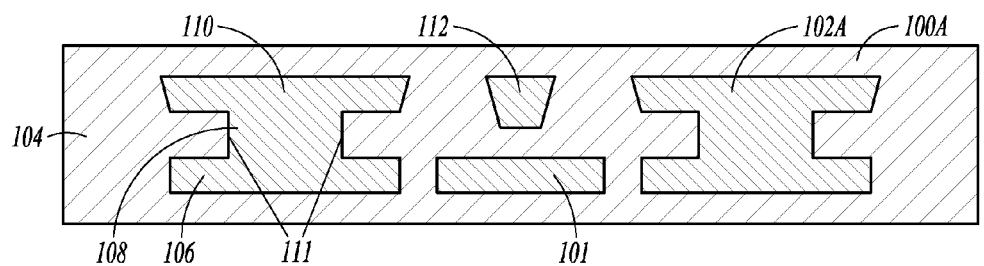
FIGS. 1A and 1B are schematic cross-sectional profiles of an electronic package.
Figure 1B:
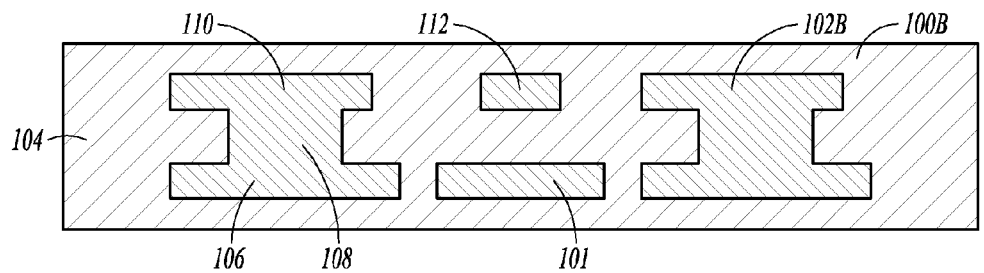

FIGS. 1A and 1B are schematic cross-sectional profiles of an electronic package 100A, 100B respectively, such as a printed circuit board or a chip package. Each package 100A, 100B includes a die 101 and electrical interconnects, such as vias 102A, 102B, within an insulator 104. The die 101 can be electrically coupled to the vias 102A, 102B (not shown). The via 102A can be formed with a scribe process, such as a laser scribe process, while the via 102B can be formed according to a dry film resist process.

Each via 102 (referring collectively to the vias 102A, 102B) and the insulator 104 can be formed in stages and/or layers. Each package 100 (referring collectively to the packages 100A, 100B) include a first metal layer 106, a second metal layer 108 including the via 102, and a third metal layer 110. It is noted that, conventionally, the package may be deemed to have only two metal layers, such as can form two traces or electrically conductive lines, with the via in between the metal layers. However, because the via 102 can be formed in three stages of SAP metal application, the via 102 can be understood, for the purposes of this description, to include three metal layers 106, 108, 110. However, such a via 102 nevertheless may only incorporate two pads in the first and third layers 106, 110, and the via conductor therebetween in the second layer 108.

In various examples, the vias 102 can be distinguished from conventional vias, such as are formed by drilling and related techniques, in that the second metal layer 108 of the vias 102 have edges 111 that are substantially parallel with respect to one another and/or are orthogonal to a major plane formed by the metal layers 106, 110, in comparison with conventional drilled vias which may have substantially conical or irregular edges, such as from laser focus variation in laser drilling or vibration or other irregularities in mechanical drilling. Owing to the process described herein, the vias 102 may be essentially the same size at the top of the second metal layer 108 as at the bottom. Additionally, owing, at least in part, to the process described herein, the vias 102 can be shaped as desired within the tolerances of the fabrication process being utilized and can incorporate as many metal layers 106, 108, 110 as desired.

The electronic package 100 can include electrically conductive lines 112. The electrically conductive lines 112 can electrically couple various components of the electronic packages 100. Such electrically conductive lines 112 can, in certain examples, be defined as existing in a single layer in the package 100, such as the layer 110 in the illustrative example, while the vias 102 extend between individual layers 106, 110. In various examples, the electrically conductive lines 112 are made of the same electrically conductive materials as the vias 102, while in various alternative examples the vias 102 and the electrically conductive lines 112 can be made of differing materials. In certain examples, electrical interconnects of electronic dies, input/output ports, and test points can be electrically coupled with respect to one another with the electrically conductive lines 112 and the vias 102.

FIGS. 2A-2H illustrate a schematic sequential process flow for making the electronic package 100A. The process flow may further be utilized for making a variety of electronic packages, while the electronic package 100A itself may be made according to any suitable specific process.

Figure 2A:
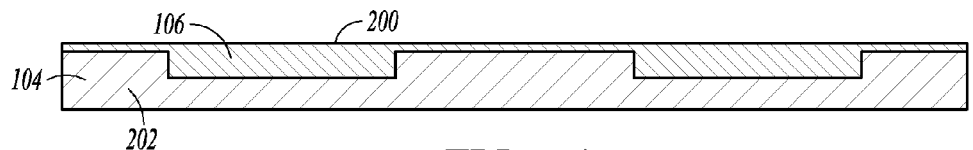
FIGS. 2A-2H illustrate a schematic sequential process flow for making an electronic package.

In FIG. 2A, a deposition layer 200 is applied above a first buildup layer 202 of the insulator 104. In various examples, the first metal layer 106 is previously embedded in the buildup layer 202. In various examples, the first metal layer 106 is applied with the deposition layer 200. In various examples, the deposition layer 200 is applied with an electroless deposition process. In various examples, the first metal layer 106 and the deposition layer 200 is copper, among various exemplary conductive materials and metals.

Figure 2B:
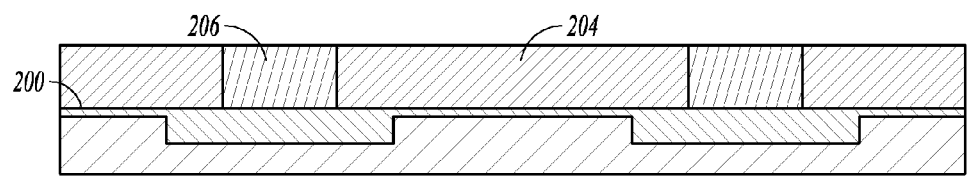

In FIG. 2B, a masking layer 204 is applied on top of the deposition layer 200. In various examples, the masking layer 204 is a dry film resist layer. In certain examples, the dry film resist is laminated on top of the deposition layer 200. In such examples, the dry film resist is exposed and developed.

As illustrated, application of the masking layer 204 leaves a cavity 206 suitably sized to admit the second metal layer 108. The masking layer 204 may be applied to form the cavity 206 in a variety of shapes and configurations, as is discussed herein. The cavity 206 can be formed through patterning in the dry film resist.

Figure 2C:
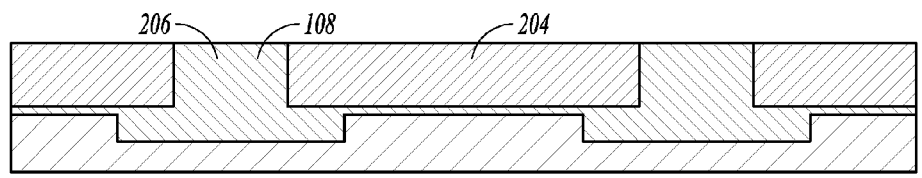

In FIG. 2C, the second metal layer 108 is applied within the cavity 206 in the masking layer 204. In various examples, the second metal layer 108 is applied with electrolytic deposition. Alternatively, the second metal layer 108 is applied through lamination or other application process. In various examples, the second metal layer 108 is formed from copper.

Figure 2D:
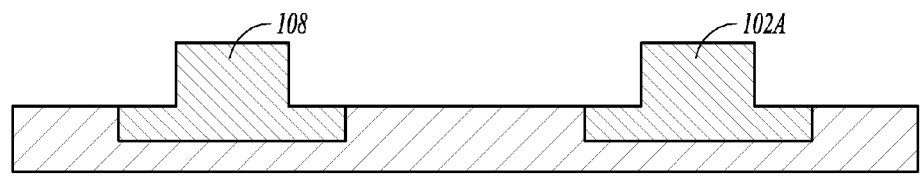

In FIG. 2D, the masking layer 204 is removed. In various examples in which the masking layer 204 is dry film resist, the masking layer 204 is removed through stripping. An etching process may be applied as well as the dry film resist stripping, such as after the dry film resist stripping, to remove, for instance, the deposition layer 200. As a result of removing the masking layer 204, the second metal layer 108 that forms the via 102A is left substantially uncovered. It is noted that, in part because of the configurability of the masking layer 204, the physical dimensions of different vias 102A and, in various specific examples metal layers 108, may vary, as disclosed herein.

Figure 2E:
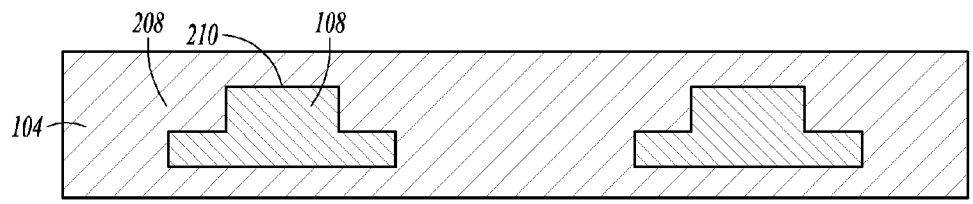

In FIG. 2E, a second buildup layer 208 of the insulator 104 is applied to substantially surround and insulate the second metal layer 108. In various examples, the second buildup layer 208 is a dielectric, as with the rest of the insulator 104. In various examples, a top surface 210 of the second metal layer 108 can be left exposed.

Figure 2F:
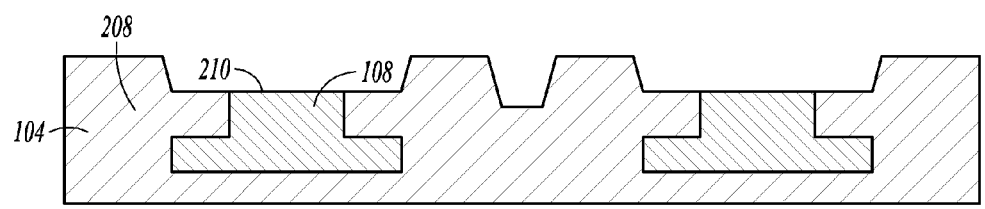

In FIG. 2F, where the top surface 210 of the second metal layer 108 was covered by the second buildup layer 208, the top surface 210 is exposed by removing a portion of the second buildup layer 208 above the top surface. In various examples, the portion of the second buildup layer 208 is removed through a laser scribe process. In various examples, one or more cavities 212 are optionally created for additional electrically conductive lines 112 in the second buildup layer 208 through the same process by which the top surface 210 is exposed. In various examples, the second metal layer 108 can act as a continuous conductive path provider between the first metal layer 106 and the third metal layer 110.

Figure 2G:
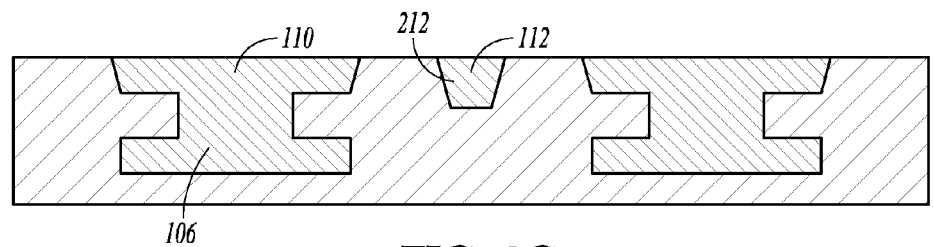

In FIG. 2G, the third metal layer 110 is applied so that the third metal layer 110 is electrically coupled to the first metal layer 106 by way of the second metal layer 108. In various examples, the third metal layer 106 is applied by electroless deposition. In various examples, a trace 112 is applied in the cavity 212, such as by electrolytic plating. In various examples, the third metal layer 110 and the trace 112 are planarized, such as through grinding and/or polishing.

Figure 2H:
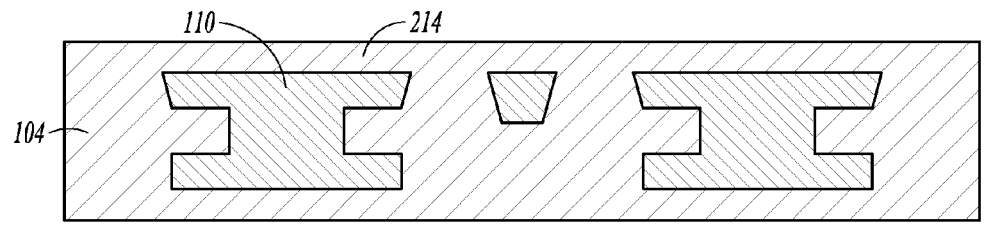

In FIG. 2H, a third buildup layer 214 of the insulator 104 is applied on top of the third metal layer 110. In various examples, the third buildup layer 214 is a dielectric, as with the rest of the insulator 104.

FIGS. 3A-3H illustrate a schematic sequential process flow for making the electronic package 100B. The process flow may further be utilized for making a variety of electronic packages, while the electronic package 100B itself may be made according to any suitable specific process.

Figure 3A:
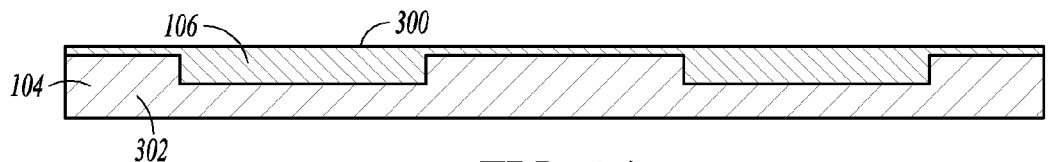
FIGS. 3A-3H illustrate a schematic sequential process flow for making an electronic package.

In FIG. 3A, a deposition layer 300 is applied above a first buildup layer 302 of the insulator 104. In various examples, the first metal layer 106 is previously embedded in the buildup layer 302. In various examples, the first metal layer 106 is applied with the deposition layer 300. In various examples, the deposition layer 300 is applied with an electroless deposition process. In various examples, the first metal layer 106 and the deposition layer 300 is copper, among various exemplary conductive materials and metals.

Figure 3B:
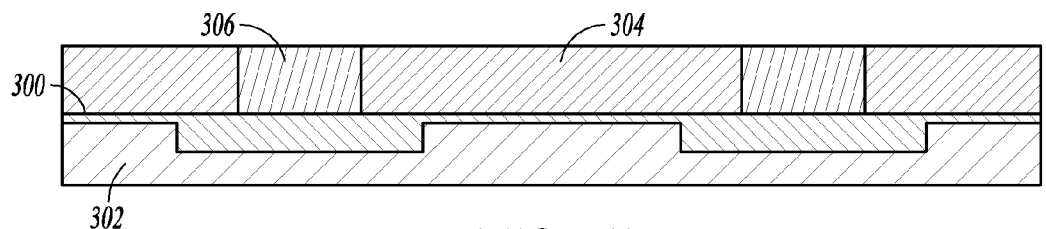

In FIG. 3B, a first masking layer 304 is applied on top of the deposition layer 300. In various examples, the first masking layer 304 is a dry film resist layer. In certain examples, the dry film resist is laminated on top of the deposition layer 300. In such examples, the dry film resist is exposed and developed.

As illustrated, application of the first masking layer 304 leaves a cavity 306 suitably sized to admit the second metal layer 108. The masking layer 304 may be applied to form the cavity 306 in a variety of shapes and configurations, as is discussed herein.

Figure 3C:
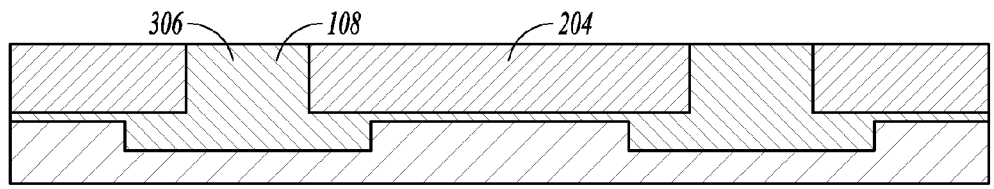

In FIG. 3C, the second metal layer 108 is applied within the cavity 306 in the first masking layer 304. In various examples, the second metal layer 108 is applied with electrolytic deposition. In various examples, the second metal layer 108 is formed from copper.

Figure 3D:
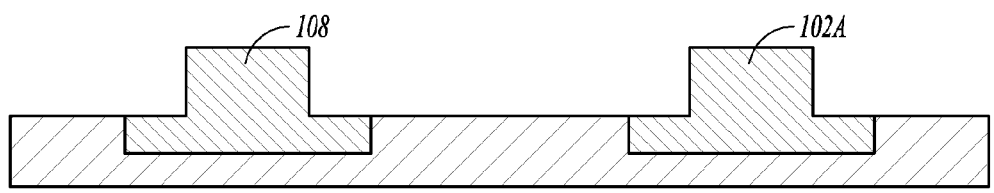

In FIG. 3D, the first masking layer 304 is removed. In various examples in which the first masking layer 304 is dry film resist, the first masking layer 304 is removed through stripping. An etching process may be applied as well as the dry film resist stripping, such as after the dry film resist stripping, to remove, for instance, the deposition layer 300. As a result of removing the first masking layer 304, the second metal layer 108 that forms the via 102B is left substantially uncovered. It is noted that, in part because of the configurability of the masking layer 304, the physical dimensions of different vias 102A and, in various specific examples metal layers 108, may vary, as disclosed herein.

Figure 3E:
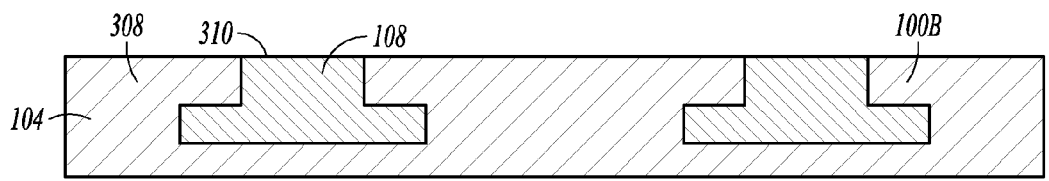

In FIG. 3E, a second buildup layer 308 of the insulator 104 is applied to substantially surround and insulate the second metal layer 108. In various examples, the second buildup layer 308 is a dielectric, as with the rest of the insulator 104. As illustrated, a top surface 310 of the second metal layer 108 is left exposed. In various examples, the top surface 310 can be covered and then revealed through processes such as are applied herein to other process steps. In various examples, the second buildup layer 308 of the chip package 100B is thinner than the second buildup layer 208 of the electronic package 100A.

Figure 3F:
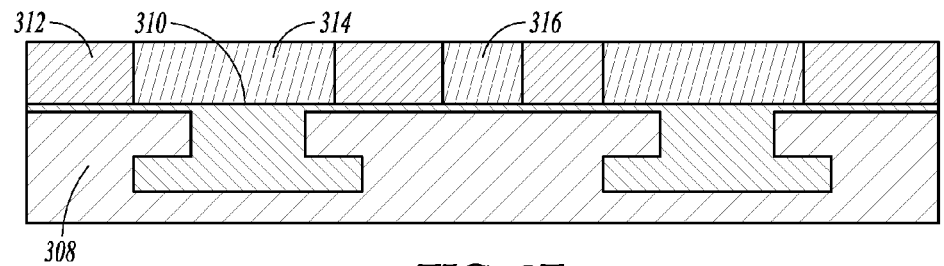

In FIG. 3F, a second masking layer 312 is applied on top of the top surface 310 and the second buildup layer 308. In various examples, the second masking layer 312 is of the same material as the first masking layer 304. In various examples, the second masking layer 312 is a dry film resist layer. In certain examples, the dry film resist is laminated on top of the top surface 310 and the second buildup layer 308. In such examples, the dry film resist is exposed and developed.

As illustrated, application of the second masking layer 312 leaves a cavity 314 suitably sized to admit the third metal layer 110 and a cavity 316 suitability sized to admit the electrically conductive lines 112. The second masking layer 312 may be applied to form the cavities 314, 316 in a variety of shapes and configurations, as is discussed herein.

Figure 3G:
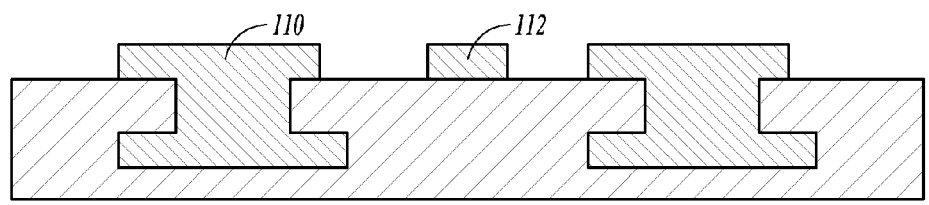

In FIG. 3G, the third metal layer 110 and electrically conductive lines 112 are applied in the cavities 314, 316, respectively, and the second masking layer 312 is removed. In various examples, the third metal layer 110 and electrically conductive lines are applied by electrolytic plating. In various examples, the third metal layer 110 is formed from copper.

Figure 3H:
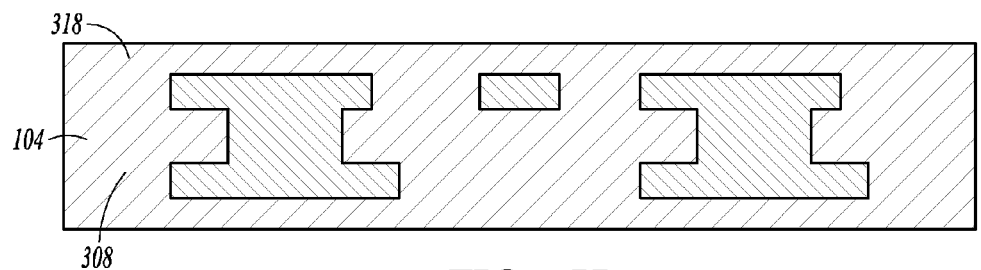

In FIG. 3H, a third buildup layer 318 is applied, such as in the manner of the second buildup layer 308. In various examples, the third buildup layer 318 is a dielectric, as with the rest of the insulator 104.

Figure 4:
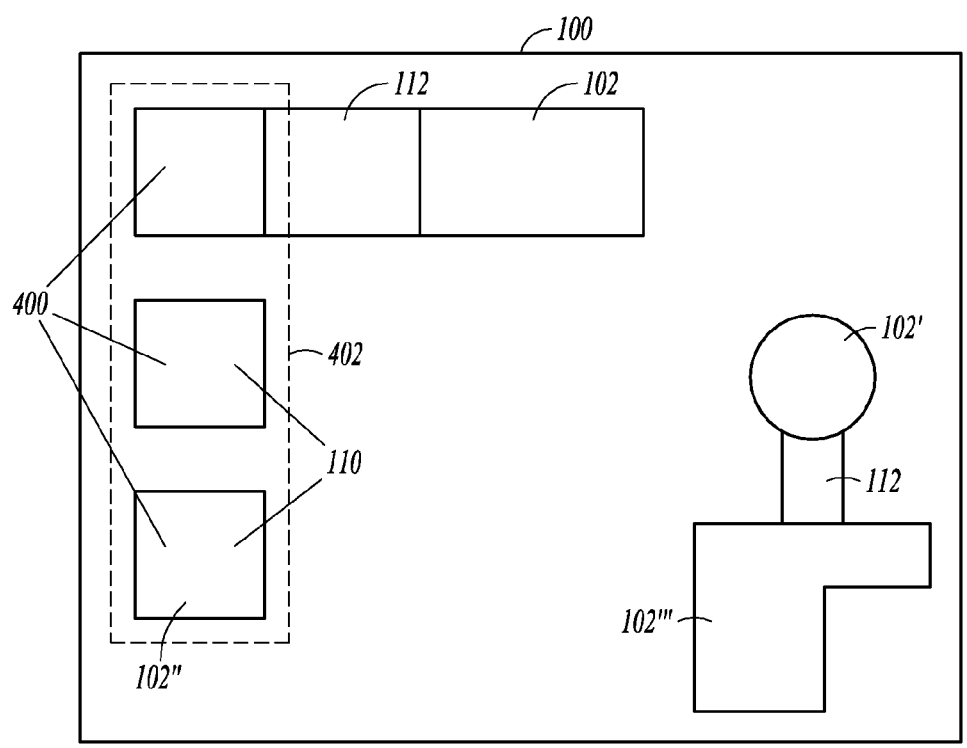
FIG. 4 is a top-view of an electronic package.

FIG. 4 is a top-view of an electronic package 100 that can be formed utilizing any of the methodologies described herein and can embody either of the electronic packages 100A, 100B described above with respect to FIGS. 1A, 1B, 2A-2H, and 3A-3H.

The electronic package 100 includes multiple vias 102 of varying shapes and sizes from a top profile of the vias 102 and the electronic package 100 generally. The vias 102 are variously connected by electrically conductive lines 112. The vias 102 can be formed in the variety of shapes and sizes according to the application of the various masking layers 204, 304, 312 and the use of insulator 104 removal processes various described herein. As the masking layers 204, 304, 312 and the insulator 104 removal processes are configurable, the cavities 206, 306, 314, 316 and so forth can similarly be of varying size and shape, and as a result the metal disposed therewithin can be of varying size and shape. In addition, in packages 100 that have multiple layers 106, 110, the vias 102 can extend through multiple layers.

As illustrated, the profiles of vias 102, such as are defined by the third metal layer 110, are of regular shapes, such as a circle 102' and a square 102", and of irregular shapes 102'''. In the illustrated example, pads 400 of an input/output assembly 402 are variably connected to a via 102 by a trace or electrically conductive line 112, are electrically coupled to a metal layer 110 of a via 102, or are a metal layer 110 of a via 102 itself. In various examples, the size of the metal layers 110 of vias 102 can be of the same or substantially similar length and/or width dimension of an electrically conductive line 112 or pad 400 to which the via 102 connects or which, in the case of certain pads 400, the via 102 forms.

Figure 5:
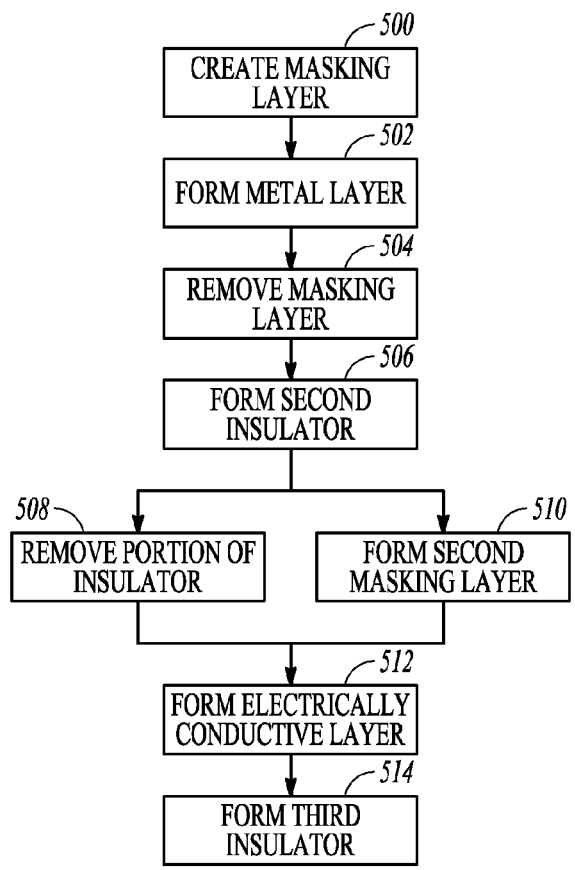
FIG. 5 is a flowchart for making an electronic package.

FIG. 5 is a flowchart for making an electronic package 100, including either of the electronic packages 100A, 100B. The flowchart may be applied to the creation of a variety of chip packages or other electronic devices in addition to the electronic packages 100A, 100B. Additionally, the electronic packages 100A, 100B may alternatively be made according to any of a variety of suitable methods.

At 500, a masking layer 204, 304 is created with respect to a first electrically conductive layer 106 embedded in a first insulator layer 202, 302, the masking layer forming a cavity 206, 306. In various examples, the first electrically conductive layer 106 can be a metal pad for the via 102 and/or can be an electrically conductive line 112. In various examples, the electrically conductive layer includes the metal pad and the electrically conductive line 112. In various examples, the masking layer 204, 304 is a dry film resist and is created with a lamination process.

At 502, a metal layer 108 is formed within the cavity 206, 306, at least a portion of the metal layer 108 being electrically coupled with the first electrically conductive layer 106 at a first end of the metal layer 108. In various examples, the metal layer 108 has a side or edge 111 that is substantially orthogonal to the first electrically conductive layer 106 and the second electrically conductive layer 110, such as to a major plane of the first electrically conductive layer 106 and a second electrically conductive layer 110. In various examples, the metal layer 108 is formed with an electrolytic deposition process, such as with a copper electrolytic deposition process.

At 504, the masking layer 204, 304 is removed, as described herein.

At 506, a second insulator layer 208, 308 is formed in a space previously occupied, at least in part, by the masking layer 204, 304, substantially embedding the metal layer 108 within the second insulator layer 208, 308.

At 508, in various examples to form the electronic package 100A, a portion of the second insulator layer 208 is removed to form a second cavity 212. In an examples, a second electrically conductive layer 110 can be formed within the second cavity 212. In various examples, the portion of the second insulator layer 208 is removed through a scribe process.

At 510, in various examples to form the electronic package 100B, a second masking layer 312 is formed on a first major surface 310 of the metal layer 108 and the second insulator layer 308. In such examples, the second masking layer 312 forms a second cavity 314 and the second electrically conductive layer 110 can be formed within the second cavity 314. In various examples, the second masking layer 312 is a dry film resist.

At 512, the second electrically conductive layer 110 is formed in the cavities 212, 314. In various examples, the second electrically conductive layer 110 is electrically coupled with the metal layer 108 at a second end of the metal layer 108. In various examples, the second electrically conductive layer 110 is a second metal pad for the via 102A and/or is an electrically conductive line 112. In various examples, the electrically conductive layer includes the second metal pad and the electrically conductive line 112. In various examples, the second masking layer 312 forms a third cavity 316 and the electrically conductive line 112 is formed within the third cavity 316.

At 514, a third insulator layer 214, 318 is formed such that it substantially envelops the second electrically conductive layer 110. In various examples, the first electrically conductive layer 106, the metal layer 108, and the second electrically conductive layer 110 form a via 102A, 102B. In such examples, the via 102A, 102B electrically couples a first electrically conductive line 112 within the first electrically conductive layer 106 and a second electrically conductive line 112 within the second electrically conductive layer 110.

In certain examples, the via 102A, 102B has a substantially non-circular profile. In certain examples, the via 102A, 102B has a substantially irregular profile. In various examples of the electronic package 100, vias 102 are included that are any of circular, non-circular, and irregular in profile.

Figure 6:
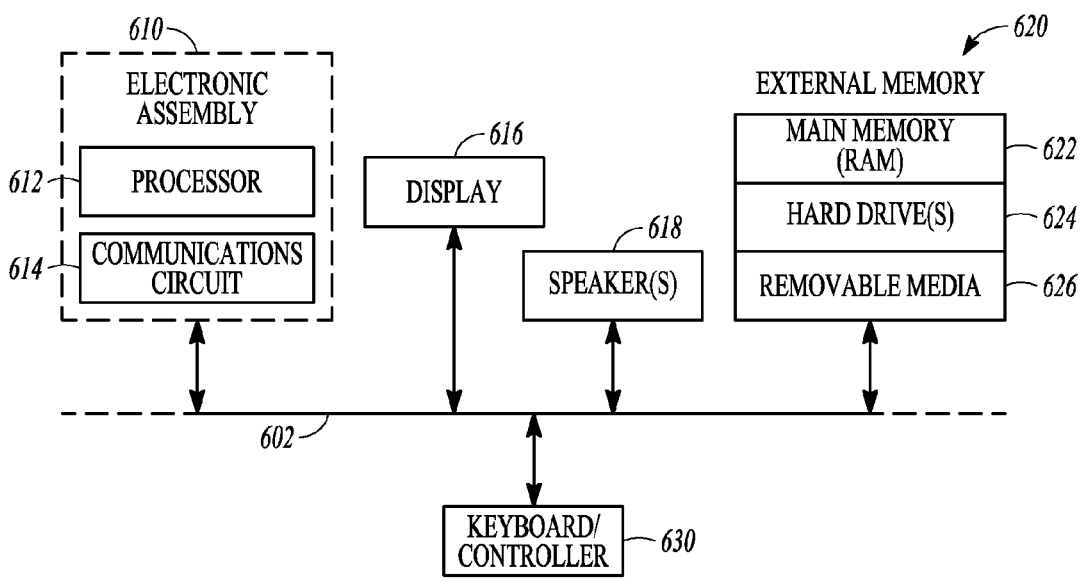
FIG. 6 is a block diagram of an electronic device incorporating at least one chip package.

An example of an electronic device using semiconductor chips and elongated structures as described in the present disclosure is included to show an example of a higher level device application for the present invention. FIG. 6 is a block diagram of an electronic device 600 incorporating at least one chip package 100, 200. The electronic device 600 is merely one example of an electronic system in which embodiments of the present invention can be used. Examples of electronic devices 600 include, but are not limited to personal computers, tablet computers, mobile telephones, personal data assistants, MP3 or other digital music players, automotive applications, embedded applications, etc. In this example, the electronic device 600 comprises a data processing system that includes a system bus 602 to couple the various components of the system. The system bus 602 provides communications links among the various components of the electronic device 600 and can be implemented as a single bus, as a combination of busses, or in any other suitable manner.

An electronic assembly 610 is coupled to the system bus 602. The electronic assembly 610 can include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 610 are a custom circuit, an application-specific integrated circuit (ASIC), or the like, such as, for example, one or more circuits (such as a communications circuit 614) for use in wireless devices like mobile telephones, pagers, personal data assistants, portable computers, two-way radios, and similar electronic systems. The IC can perform any other type of function.

The electronic device 600 can also include an external memory 620, which in turn can include one or more memory elements suitable to the particular application, such as a main memory 622 in the form of random access memory (RAM), one or more hard drives 624, and/or one or more drives that handle removable media 626 such as compact disks (CD), digital video disk (DVD), and the like.

The electronic device 600 can also include a display device 616, one or more speakers 618, and a keyboard and/or controller 630, which can include a mouse, trackball, touch screen, voice-recognition device, or any other device that permits a system user to input information into and receive information from the electronic device 600.

ADDITIONAL EXAMPLES

Example 1 may include subject matter (such as an apparatus, a method, a means for performing acts) that can include a method of making an electrical package. The method may comprise creating a masking layer with respect to a first electrically conductive layer embedded in a first insulator layer, the masking layer forming a cavity, forming a metal layer within the cavity, at least a portion of the second metal layer being electrically coupled with the first electrically conductive layer at a first end of the metal layer, removing the masking layer, forming a second insulator layer in a space previously occupied, at least in part, by the masking layer, substantially embedding the second metal layer within the second insulator layer, and forming a second electrically conductive layer electrically coupled with the metal layer at a second end of the metal layer.

In Example 2, the method of Example 1 can optionally further include removing a portion of the second insulator layer to form a second cavity, and wherein the second electrically conductive layer is formed within the second cavity.

In Example 3, the method of any one or more of Examples 1 and 2 can optionally further include that the portion of the second insulator layer is removed through a scribe process.

In Example 4, the method of any one or more of Examples 1-3 can optionally further include forming a second masking layer on a first major surface of the metal layer and the second insulator layer, the second masking layer forming a second cavity, and wherein the second electrically conductive layer is formed within the second cavity.

In Example 5, the method of any one or more of Examples 1-4 can optionally further include that the masking layer and the second masking layer are a dry film resist.

In Example 6, the method of any one or more of Examples 1-5 can optionally further comprise forming a third insulator layer substantially enveloping the second electrically conductive layer.

In Example 7, the method of any one or more of Examples 1-6 can optionally further include that the first electrically conductive layer, the metal layer, and the second electrically conductive layer form a via, wherein the via electrically couples a first electrically conductive line and a second electrically conductive line.

In Example 8, the method of any one or more of Examples 1-7 can optionally further include that the via has a substantially non-circular profile.

In Example 9, the method of any one or more of Examples 1-8 can optionally further include that the via has a substantially irregular profile.

In Example 10, the method of any one or more of Examples 1-9 can optionally further include that the metal layer has a side substantially orthogonal to the first electrically conductive layer and the second electrically conductive layer.

In Example 11, the method of any one or more of Examples 1-10 can optionally further include that forming the metal layer is with an electrolytic deposition process.

In Example 12, the method of any one or more of Examples 1-11 can optionally further include that forming the metal layer is with a copper electrolytic deposition process.

In Example 13, the method of any one or more of Examples 1-12 can optionally further include that creating the masking layer is with a lamination process.

Example 14 may include subject matter (such as an apparatus, a method, a means for performing acts) that can include an electronic package that comprises a first electrically conductive layer embedded in a first insulator layer, a second electrically conductive layer embedded in a second insulator layer, and a metal layer embedded in a third insulator layer and having a side substantially orthogonal to the first electrically conductive layer and the second electrically conductive layer, the metal layer electrically coupling the first electrically conductive layer to the second electrically conducive layer.

In Example 15, the device of Example 14 can optionally further include that the first electrically conductive layer, the second electrically conductive layer, and the metal layer form a via, wherein the via has a substantially non-circular profile.

In Example 16, the device of any one or more of Examples 14 and 15 can optionally further include that the via has a substantially regular profile.

In Example 17, the device of any one or more of Examples 14-16 can optionally further include that the via has a substantially irregular profile.

Example 18 may include subject matter (such as an apparatus, a method, a means for performing acts) that can include an electronic package assembly that comprises an electrically conductive layer embedded in a first insulator layer, a masking layer formed with respect to a first electrically conductive layer, the masking layer forming a cavity, and a metal layer formed within the cavity, at least a portion of the second metal layer being electrically coupled with the first electrically conductive layer at a first end of the metal layer, the metal layer having a side substantially orthogonal to the electrically conductive layer.

In Example 19, the device of Example 18 can optionally further include that the masking layer is a dry film resist layer.

In Example 20, the device of any one or more of Examples 18 and 19 can optionally further include that at least one of the electrically conductive layer and the metal layer have a non-circular profile.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method, comprising:
creating a masking layer with respect to a first electrically conductive layer embedded in a first insulator layer, the masking layer forming a cavity;
forming a first metal layer and a second metal layer within the cavity, the first metal layer spaced apart from the second metal layer, at least a portion of each of the first and second metal layers being electrically coupled with the fist electrically conductive layer at a first end of the respective first and second metal layers, the first metal layer being electrically coupled to the second metal layer via the first electrically conductive layer;
removing the masking layer and some of the first electrically conductive layer to create a first portion of the first electrically conductive layer and a second portion of the electrically conductive layer spaced apart from the first portion, the first portion of the first electrically conductive layer coupled to the first metal layer and the second portion of the first electrically conductive layer coupled to the second metal layer, the first metal layer electrically isolated from the second metal layer;
forming a second insulator layer in a space previously occupied, at least in part, by the masking layer, substantially embedding the first and second metal layers within the second insulator layer;
forming a second electrically conductive layer electrically coupled with at least one of the first and second metal layers at a second end of the at least one of the first and second metal layers; and
forming a third insulator layer in direct contact with and substantially enveloping the second electrically conductive layer and covering a major surface of the second insulator layer.

2. The method of claim 1, further comprising removing a portion of the second insulator layer to form a second cavity, and wherein the second electrically conductive layer is formed within the second cavity.

3. The method of claim 2, wherein the portion of the second insulator layer is removed through a scribe process.

4. The method of claim 1, further comprising forming a second masking layer on a first major surface of the at least one of the first and second metal layers and the second insulator layer, the second masking layer forming a second cavity, and wherein the second electrically conductive layer is formed within the second cavity.

5. The method of claim 4, wherein the masking layer and the second masking layer are a dry film resist.

6. The method of claim 1, wherein the second electrically conductive layer includes a first portion in contact with the first metal layer and the second electrically conductive layer includes a second portion in contact with the second metal layer, wherein the first electrically conductive layer, the first metal layer, and the first portion of the second electrically conductive layer form a first via, wherein the first electrically conductive layer, the second metal layer, and the second portion of the second electrically conductive layer form a second via.

7. The method of claim 6, wherein at least one of the first and second vias has a substantially non-circular profile.

8. The method of claim 7, wherein the at least one of the first and second vias has a substantially irregular profile.

9. The method of claim 1, wherein the first and second metal layers each has a side substantially orthogonal to the first electrically conductive layer and the second electrically conductive layer.

10. The method of claim 1, wherein forming the first and second metal layers is with an electrolytic deposition process.

11. The method of claim 10, wherein forming the first and second metal layers is with a copper electrolytic deposition process.

12. The method of claim 1, wherein creating the masking layer is with a lamination process.

\* \* \* \* \*